United States Patent [19]

Auracher et al.

[11] Patent Number: 5,023,885
[45] Date of Patent: Jun. 11, 1991

[54] EXTERNAL OPTICAL RESONATOR FOR A SEMICONDUCTOR LASER

[75] Inventors: Franz Auracher, Baierbrunn; Eckhard Meissner; Bernd Noll, both of Munich; Julius Wittmann, Oberhaching, all of Fed. Rep. of Germany

[73] Assignee: Siemens Aktiengesellschaft, Berlin and Munich, Fed. Rep. of Germany

[21] Appl. No.: 383,755

[22] Filed: Jul. 24, 1989

[30] Foreign Application Priority Data

Sep. 20, 1988 [DE] Fed. Rep. of Germany ....... 3831943

[51] Int. Cl.$^5$ .............................................. H01S 3/08
[52] U.S. Cl. .......................................... 372/92; 372/6; 372/97; 372/98; 372/107; 372/108; 372/99; 350/96.12; 350/96.15
[58] Field of Search ................... 372/6, 92, 93, 94, 97, 372/98, 99, 107, 108; 350/96.12, 96.15

[56] References Cited

U.S. PATENT DOCUMENTS

| 4,690,488 | 9/1987 | Gee et al. ......................... 350/96.12 |
| 4,794,617 | 12/1988 | Boeck .................................... 372/92 |
| 4,799,234 | 1/1989 | Haeussler et al. ..................... 372/97 |
| 4,831,631 | 5/1989 | Haeussler et al. ..................... 372/92 |

OTHER PUBLICATIONS

Wyatt et al., "Tunable Narrow Line External Cavity Lasers for Coherent Optical Systems", *Br Telecom Technol. J.*, vol. 3, No. 4, Oct. 1985, pp. 5-12.

*Primary Examiner*—Georgia Epps
*Attorney, Agent, or Firm*—Hill, Van Santen, Steadman & Simpson

[57] ABSTRACT

An external optical resonator for a semiconductor laser is composed of an optical directional coupler which can be formed as an integrated optical coupler with a short structural length that enables a free spectral range in the order of 100 GHz and enables the resonator and the system fiber to be coupled to the same end face of the laser. The resonator structure includes two optical waveguides with feedback means applied on the end faces of one of the waveguides and the other waveguide having one end face coupled to receive the output of the laser and the other end face of the other waveguide being coupled to the system fiber. The arrangement is particularly useful for tunable semiconductor lasers, particularly for heterodyne reception.

15 Claims, 1 Drawing Sheet

EXTERNAL OPTICAL RESONATOR FOR A SEMICONDUCTOR LASER

BACKGROUND OF THE INVENTION

The present invention is directed to an external optical resonator for a semiconductor laser which is composed of an optical directional coupler comprising two optical waveguides wherein the optical power beamed out of the semiconductor laser through an end face of one of the two waveguides can be coupled into the directional coupler and can be taken from the other end face of this one waveguide and whereby the optical feedback means is arranged at every end face of the other optical waveguide of the two waveguides, said optical feedback means at least partially coupling optical power supplied from the other waveguide back to the other waveguide.

Single-mode, narrow-band laser transmitters are required for the realization of coherently optical transmission systems. Fabry-Perot semiconductor lasers have a multi-mode structure. In combination with external resonators, narrow-band, single-mode laser transmitters can be realized from such a semiconductor laser and are suitable for optical communication systems having heterodyne or homodyne reception (see the article from *Brit. Telecom. Techn. Journal*, Vol. 3, No. 4, 1985).

European Application A2-0 216 212 discloses an external optical resonator that is composed of an optical directional coupler comprising two optical waveguides wherein the light powered beam-out by the semiconductor laser can be coupled into the directional coupler through an end face of one of the two waveguides. A feedback means is provided at the other end face of this one waveguide, and this feedback means feeds a slight part of the optical power supplied in the one waveguide back into the one waveguide but couples the majority part of this optical power out of this one waveguide.

The out-coupled optical power supplied through a fiber to an end face of another waveguide of the directional coupler and is coupled into this other waveguide. An optical power coupled out from the other end face of the other waveguide is supplied either to a radiation absorber or is coupled into a system fiber as an output power of the semiconductor laser. In this last embodiment, the system fiber and the resonator are coupled to the same end face of the laser. In comparison to the embodiment wherein the resonator and the system fiber are coupled to different end faces of the laser, this has the advantage that the mechanical outlay is reduced.

The optical directional couplers can be composed of an optical fiber directional coupler or of an integrated directional coupler. A second feedback means that feeds a slight part of the optical power supplied in the fiber back into the fiber can be arranged at the other port of the other waveguide of the directional coupler.

An external optical resonator in the form of a fiber-optical directional coupler comprising two optical waveguides wherein it is possible to couple the resonator and the system fiber to the same end face of the semiconductor laser is proposed in U.S. Pat. No. 4,799,234, which claims priority from German Application 36 33 077 and whose disclosure is herein by reference thereto. This frequency-selective fiber directional coupler is composed of a dispersive double-core fiber, wherein the two cores form the two optical waveguides of the directional coupler. One end face of one core is coupled to the semiconductor laser and the end face of the other core is arranged at the same side as this one end face is free of any connection. A feedback means is arranged at the other end faces of both cores and this feedback means feeds a slight part of the optical power supplied in the one core back into this one core and couples the other part out of the core. The feedback means has no further function with respect to the other core. The optical power coupled out from the one core is coupled into a system fiber.

U.S. Pat. No. 4,831,631, whose disclosure is incorporated herein by referenc thereto and which claims priority from German Application 36 33 076, proposes external resonators for semiconductor lasers that are constructed with integrated-optical directional couplers and wherein the system fiber and the resonator are coupled to the same end face of the semiconductor laser. The two optical waveguides of the directional coupler are strip waveguides integrated on a substrate. The optical power emitted by the semiconductor laser is coupled into one strip waveguide and a feedback means is provided at the other end face of this waveguide. This feedback means couples the optical power supplied from this one waveguide into this waveguide. A feedback means is provided at the end face of the other strip waveguide that is arranged at the same side as the other end face of the one waveguide, and this feedback means feeds the optical power supplied in the other waveguide back into this other waveguide. The system fiber is coupled to the other end face of the other waveguide. In order to achieve a single-mode operation, it is important that the two feedback means are arranged at different optical spacings from a coupling path of the directional coupler. The coupling path of the directional coupler is defined by the distance in which its two waveguides are conducted at such a slight distance from one another, side-by-side, that a coupling of power between the two waveguides will occur.

SUMMARY OF THE INVENTION

The object of the present invention is to provide an external optical resonator for a semiconductor laser which is manufacturable with little adjustment outlay. The resonator comprises an optical directional coupler having two waveguides, which coupler is producible in an integrated technology in a short structural length that has a free spectral region in the 100 GHz range and, in addition, the resonator and the system fiber can be coupled to the same end face of the laser. To obtain these objects, the present invention is directed to an external resonator composed of an optical directional coupler comprising a first and second waveguide, said optical directional coupler being arranged so that the optical power beamed out of the semiconductor laser is coupled into an end face of the first waveguide of the directional coupler and is coupled out of the directional coupler at the other end face of the first waveguide, said directional coupler including optical feedback means arranged at each of the end faces of the second waveguide, said optical feedback means at least partially coupling optical power supplied in the second waveguide back into the second waveguide.

The critical difference of the resonator of the invention compared to known resonators or those proposed in the above-mentioned U.S. Patents is that no feedback means is arranged at the first waveguide of the optical directional coupler into which the optical power emitted by the semiconductor laser is coupled, and that a feedback means is arranged on both end faces of the other or second waveguide.

In a resonator of the present invention, the directional coupler is preferably composed of an integrated-optical directional coupler. However, other directional couplers, for example fiber directional couplers, can also be employed, particularly when it is not a matter of a short channel length.

When the optical directional coupler has at least one of the two waveguides with an index of refraction which is variable, then the resonant frequency and the phase of the resonator can be matched or adapted to each other.

A resonator of the invention can be advantageously realized in a short structural length of a few millimeters. As a result of this short structural length, a free spectral region FSR and, thus, a tuning region of a few 100 GHz can be realized for the laser transmitter associated with this resonator and this is required for an optical, multichannel transmission.

The tuning of the resonator, which has at least one of the waveguides with a variable refractive index, can be accomplished electrically, for example, if the waveguide is composed of an electro-optical material and the resonator includes a means for generating a variable electrical field to apply to the electro-optical material. It is also possible for the waveguide with a variable index of refraction to be composed of a magneto-optical material and means being provided for generating a magnetic field for application on the magneto-optical material is provided.

It should be pointed out in this context that integrated-optical, external resonators comprising a directional coupler having two waveguides has already been proposed in the above-mentioned U.S. Pat. No. 4,831,631 and that this patent discloses that at least one of the wavequides is composed of an electro-optical material and has means for generating a variable electrical field. This means is a phase modulator wherein it serves the purpose of generating a frequency-modulated output signal.

It is also possible that the waveguide with the variable index of refraction is thermically or mechanically tunable to create a thermically or mechanically tunable resonator. For example, if the waveguide with the variable index of refraction is composed of a thermo-optical material, and the resonator includes means for varying the temperature of the thermo-optical material, this will cause a change in the index of refraction. On the other hand, if the waveguide with the variable refractive index is composed of elasto-optical material and the resonator includes means for exerting a mechanical force, such as a pressure or a pull on the elasto-optical material, then the index of refraction can, thus, be changed.

It is also possible to obtain a tunable resonator in accordance with the present invention if a length of at least one of the two waveguides of the directional coupler is varied. This can be likewise achieved by modifying the temperature of the waveguide or by exerting a pressure or pull thereon.

The feedback means of the resonator of the present invention can be composed of a mirror layer applied on the carrier member.

Other advantages and features of the invention will be readily apparent from the following description of the preferred embodiments, the drawings and claims.

DESCRIPTION OF THE PREFERRED EMBODIMENTS

Figure 1:
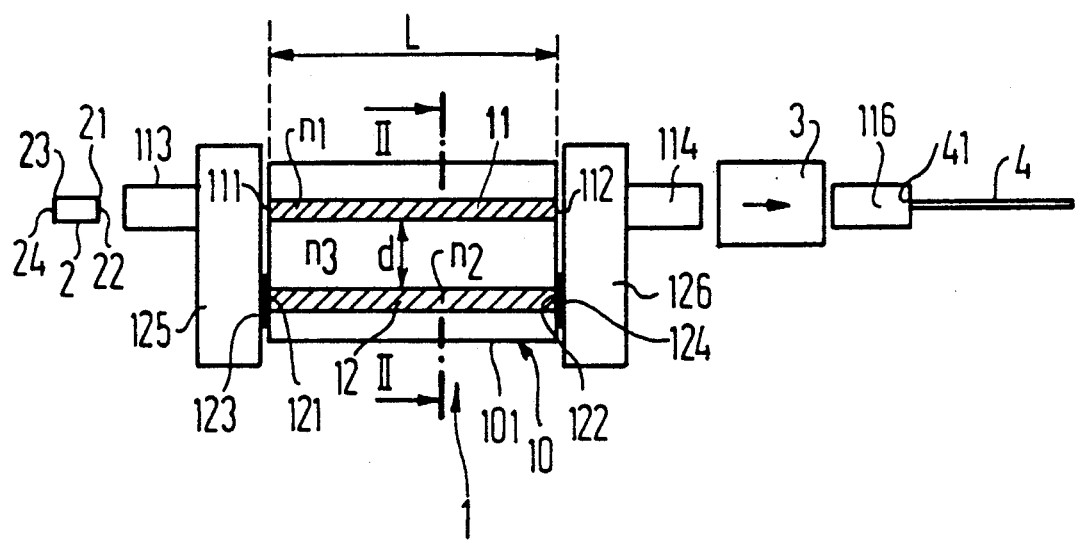
FIG. 1 is a schematic illustration, which is not too true-to-scale, of a laser transmitter comprising a resonator of the present invention to which a system fiber is coupled.

The principles of the present invention are particularly useful when incorporated into an external optical resonator, generally indicated at 1 in FIG. 1, which is used with a semiconductor laser 2. The semiconductor laser 2 has an end face 21 that is provided with an anti-reflection layer 22 and the output power of the laser 2 is taken from this end face with a minimal amount of reflection. The semiconductor laser 2 also has an end face 23 which faces away from the resonator 1, and this end face 23 is provided with a mirror layer 24 in order to increase the output power of the laser.

The resonator 1 is essentially composed of an optical directional coupler, generally indicated at 10, and two feedback means 123 and 124. The optical directional coupler 11 is composed of two integrated strip waveguides 11 and 12 on a substrate, for example an electro-optical material which may be lithium niobate. The strip waveguides 11 and 12 are conducted at such a slight distance d next to one another along a coupling path L that a crossover of power between them will occur. The refractive indices $n_1$ and $n_2$ of the two waveguides 11 and 12, respectively, are higher than the index of refraction $n_3$ of the substrate material. The refractive indices $n_1$ and $n_2$ can be identical.

In the illustrated exemplary embodiment, the coupling path L is selected equal to the structural length of the directional coupler and, thus, essentially corresponds to the structural length of the resonator. The optical power emitted by the semiconductor laser 2 from the end face 21 is focused onto an end face 111 of the first waveguide 11 by a first gradient lens 113 through a glass lamina 125 and is, thus, coupled into this first waveguide 11. In-coupled optical power is coupled out of the first waveguide 11 through the other end face 112 and transirradiates through a glass lamina 126 and is focused by another or second gradient lens 114. The focused optical power is focused onto the end face 41 of a system fiber 4 by a further or third gradient lens 116 and is coupled into the system fiber 4 as the output power of the laser 2. In the illustrated embodiment, an optical isolator 3, that suppresses parasitic reflections from the system that could otherwise proceed to the semiconductor laser 2, is arranged in the beam path of the optical power coupled from the one or first waveguide 11 and is arranged before the system fiber 4. For example, it is illustrated as being arranged between the second gradient lens 114 and the third gradient lens 116.

The glass laminate 125 and 126 each serve as carrier members for the feedback means 123 and 124, respectively. For example, each of the feedback means 123 and 124 can comprise a local metallization on a surface of the glass laminate 125 and 126, respectively, for example a gold-plated layer.

These two feedback means 123 and 124 are arranged at opposite ends of the second waveguide 12, for example with the feedback means 123 located opposite an end 121 of the second waveguide 12 and the feedback means 124 arranged opposite the end face 122 of the second waveguide.

In FIG. $n_1$ denotes the index of refraction of the first waveguide 11; $n_2$ is the index of refraction of the other or second waveguide 12; and $n_3$ is the index of refraction of the substrate 101 that must be smaller than $n_1$ and smaller than $n_2$.

For that case wherein $n = n_2 = n$, resonance occurs at $\beta \cdot L = m \cdot \pi$ in the resonator of FIG. 1 with a free spectral region of $FSR = c/2n \cdot L$, whereby $\beta$ is the propagation constant of the optical wave guided in the waveguides 11 and 12 and m is an arbitrary, number. The finesse or refinement of H integer structure of the resonator according to FIG. 1 amounts to $F = \pi \sqrt{R} \cdot \cos^2 kL/(1 - R\cos^2 kL)$, wherein R is the power reflection factor of the feedback means 123 and 124 and k the coupling coefficient.

The resonant frequency of the resonator according to FIG. 1 can be tuned by varying the refractive index $n_2$. The phase of the reflected light can be tuned via changing the index of refraction $n_1$.

Figure 2:
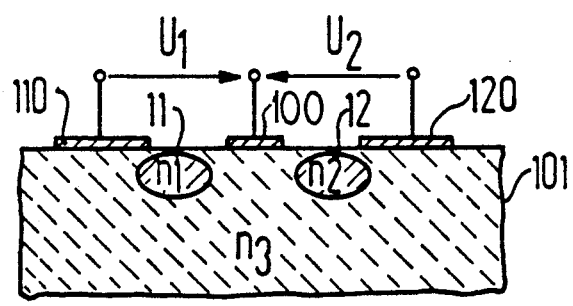
FIG. 2 is a cross sectional view taken along the lines II—II of FIG. 1 wherein electrodes for applying control voltages for the variation of the refractive index of the waveguides are provided.

How the refractive indices of the waveguides 11 and 12 can be varied has already been mentioned. FIG. 2 indicates an example wherein the resonator of FIG. 1 is electrically tunable.

In the example of FIG. 2, the substrate 101 is composed of lithium niobate. The waveguides 11 and 12 are diffused into this substrate. Let it be assumed that $n = n_2 = n$ is valid. An electrode 100 is applied on the substrate or arranged over the substrate and proceeds between the two waveguides 11 and 12 in a longitudinal direction thereof. Two additional electrodes 110 and 120 are also applied on the substrate 101 or are arranged above the surface to proceed on the outside of the two waveguides 11 and 12 along their longitudinal direction.

For tuning the resonant frequency of the resonator according to FIG. 2, an electrical voltage $U_2$ is applied between the electrode 100 and the electrode 120. This electrical voltage $U_2$ generates an electrical field in the other or second waveguide 12 that proceeds transversely to the longitudinal direction thereof and varies the index of refraction $n_2$.

In a similar manner, electrical voltage $U_1$ is applied between the electrodes 110 and 100, and this electrical voltage U generates an electrical field in the first or one waveguide 11 that will proceed transverse relative to the longitudinal direction thereof and vary the index of refraction n of this first waveguide 11. The laser transmitter can be tuned within the free spectral range FSR by setting the voltages $U_1$ and $U_2$ A voltage length product of 90 volts·mm given a wavelength of 1.3 $\mu$m is adequate for the frequency variation around a free spectral region FSR. Given a resonator length of, for example, 1 mm, the required voltages $U_1$ and $U_2$, thus, lies in the region of $\pm 45$ volts.

Although various minor modifications may be suggested by those versed in the art, it should be understood that we wish to embody within the scope of the patent granted hereon all such modifications as reasonably and properly come within the scope of our contribution to the art.

We claim:

1. An external resonator for a semiconductor laser, said resonator comprising an optical directional coupler having a first optical waveguide having end faces, a second optical waveguide having end faces, said resonator being positioned relative to the semiconductor laser for the optical power beamed out of the laser to be coupled into an end face of the first optical waveguide, said directional coupler having optical feedback means arranged at each of the end faces of the second optical waveguide, said optical feedback means at least partially coupling optical power supplied in the second waveguide back into the second waveguide so that the optical power coupled into the optical directional coupler is coupled out of the other end face of the first waveguide.

2. An external resonator according to claim 1, wherein the directional coupler is composed of an integrated optical directional coupler.

3. An external resonator according to claim 2, wherein at least one of the first and second waveguides of the directional coupler has a variable index of regfraction.

4. An external resonator according to claim 3, wherein the one waveguide having a variable index of refraction is composed of an electro-optical material and said resonator includes means for applying a variable electrical field to the material.

5. An external resonator according to claim 4, wherein the feedback means is composed of a mirror layer being applied on a carrier member, said mirror layer being arranged opposite each of the end faces of the second waveguide.

6. An external resonator according to claim 3, wherein the waveguide having the variable index of refraction is composed of a magneto-optical material and said resonator includes means for generating a magnetic field to be applied to the magneto-optical material.

7. An external resonator according to claim 6, wherein each of the feedback means is composed of a mirror layer applied on a carrier member, said mirror layers being arranged opposite the respective end faces of the second waveguide.

8. An external resonator according to claim 3, wherein the waveguide with the variable index of refraction is composed of a thermo-optical material and the resonator includes means for varying the temperature of the thermo-optical material.

9. An external resonator according to claim 8, wherein the optical length of at least one of the two waveguides of the directional coupler is variable.

10. An external resonator according to claim 8, wherein the feedback means adjacent each end face of the second waveguide comprises a mirror layer applied to a carrier member, said carrier members being arranged with the mirror layers being adjacent one of the end faces of the second waveguide.

11. An external resonator according to claim 3, wherein the waveguide with the variable index of refraction is an elasto-optical material and the resonator includes means for exerting a mechanical force on the elasto-optical material.

12. An external resonator according to claim 11, wherein the feedback means adjacent each of the end faces of the second waveguide comprises a mirror layer applied on a carrier member, said carrier members being arranged with their respective mirror layers adjacent the end faces of the second waveguide.

13. An external resonator according to claim 11, wherein the mechanical force is a pull force to change the length of at least one of the optical waveguides.

14. An eternal resonator according to claim 1, wherein both of the first and second waveguides of the directional coupler are composed of an electro-optical material having a variable index of refraction and the resonator includes means for generating a variable electric field to apply on the electro-optical material to change the index of refraction.

15. An external resonator according to claim 14, wherein the means for generating a variable electrical field applies a different electrical field to each of the first and second optical waveguides so that the index of refraction of each of the two waveguides can be independently changed.

* * * * *